(12) United States Patent
Ammar et al.

(10) Patent No.: US 6,498,551 B1
(45) Date of Patent: Dec. 24, 2002

(54) MILLIMETER WAVE MODULE (MMW) FOR MICROWAVE MONOLITHIC INTEGRATED CIRCUIT (MMIC)

(75) Inventors: Danny F. Ammar, Windermere, FL (US); Eugene Fischer, Clermont, FL (US); Gavin Clark, Tavares, FL (US); John Hubert, Clermont, FL (US); Glenn Larson, Winter Garden, FL (US)

(73) Assignee: Xytrans, Inc., Orlando, FL (US)

( * ) Notice: Subject to any disclaimer, the term of this patent is extended or adjusted under 35 U.S.C. 154(b) by 0 days.

(21) Appl. No.: 09/933,128

(22) Filed: Aug. 20, 2001

(51) Int. Cl.$^7$ ................................................ H01P 1/00
(52) U.S. Cl. ........................... 333/247; 333/33; 333/34; 333/246; 333/260; 257/728
(58) Field of Search ........................... 333/33, 34, 246, 333/247, 260; 257/728.8

(56) References Cited

U.S. PATENT DOCUMENTS

| | | | |
|---|---|---|---|
| 3,745,489 A | 7/1973 | Cristal et al. ................. 333/70 |
| 4,701,727 A | 10/1987 | Wong .......................... 333/204 |
| 4,967,201 A | 10/1990 | Rich, III ..................... 342/175 |
| 4,992,759 A | 2/1991 | Giraudeau et al. .......... 333/204 |
| 5,146,453 A | 9/1992 | Nagler et al. ................. 370/16 |
| 5,451,883 A | 9/1995 | Staab .......................... 324/758 |
| 5,545,924 A | 8/1996 | Contolatis et al. .......... 257/724 |
| 5,552,752 A | 9/1996 | Sturdivant et al. .......... 333/243 |
| 5,619,399 A | 4/1997 | Mok ........................... 361/707 |
| 5,631,446 A | 5/1997 | Quan ........................... 174/254 |
| 5,668,408 A | * 9/1997 | Nicholson .................... 257/699 |
| 5,729,433 A | 3/1998 | Mok ........................... 361/704 |
| 5,823,790 A | 10/1998 | Magnuson .................... 439/63 |
| 5,834,335 A | 11/1998 | Buschbom .................. 438/107 |
| 5,886,590 A | 3/1999 | Quan et al. .................... 333/33 |
| 5,948,960 A | 9/1999 | Langmack et al. ........... 73/1.88 |
| 5,982,186 A | 11/1999 | Buschbom .................. 324/755 |
| 5,982,250 A | * 11/1999 | Hung et al. .................. 333/246 |
| 5,982,580 A | 11/1999 | Woldemar et al. ....... 360/97.02 |
| 6,039,580 A | * 3/2000 | Sciarretta et al. ........... 333/243 |
| 6,041,245 A | 3/2000 | Mansour ...................... 505/210 |
| 6,079,999 A | 6/2000 | Terry et al. .................. 439/326 |
| 6,091,868 A | 7/2000 | Tartarilla et al. .............. 385/19 |
| 6,114,869 A | 9/2000 | Williams et al. ............. 324/765 |
| 6,124,636 A | 9/2000 | Kusamitsu ................... 257/728 |
| 6,130,189 A | 10/2000 | Matthaei ...................... 505/210 |
| 6,130,587 A | 10/2000 | Jun et al. ..................... 333/24.2 |
| 6,137,296 A | 10/2000 | Yoon et al. .................. 324/754 |
| 6,192,576 B1 | 2/2001 | Tan et al. ...................... 29/714 |
| 6,198,367 B1 | * 3/2001 | Matsunaga et al. ......... 333/246 |
| 6,217,382 B1 | 4/2001 | Ziers .......................... 439/578 |
| 6,242,933 B1 | 6/2001 | Yap ............................. 324/755 |
| 6,252,415 B1 | 6/2001 | Lefever et al. .............. 324/761 |
| 6,265,774 B1 | * 7/2001 | Sholley et al. .............. 257/708 |

* cited by examiner

*Primary Examiner*—Michael Tokar
*Assistant Examiner*—Linh Van Nguyen
(74) *Attorney, Agent, or Firm*—Allen, Dyer, Doppelt, Milbrath & Gilchrist, P.A.

(57) ABSTRACT

A low cost millimeter wave (MMW) module for a microwave monolithic integrated circuit (MMIC) includes a carrier board formed of a dielectric material and having at least one MMIC die mounted thereon and at least one interface line, such as a 50 Ohm microstrip interface line. A base plate is formed of a material that has a higher unmatched coefficient of thermal expansion (CTE) than the carrier board and supports same. A housing is mounted over the carrier board and engages the base plate. The housing has at least one subminiature coaxial connector (SMA) interface mounted thereon. A flexible circuit interconnect, such as a fuzz button, connects the subminiature coaxial connector and MMIC die through the interface line. A thermal interface member is positioned between the carrier board and base plate to aid in heat transfer between the base plate and housing and the lower CTE carrier board.

28 Claims, 3 Drawing Sheets

MILLIMETER WAVE MODULE (MMW) FOR MICROWAVE MONOLITHIC INTEGRATED CIRCUIT (MMIC)

FIELD OF THE INVENTION

This invention relates to millimeter wave modules (MMW), and more particularly, this invention relates to a millimeter wave module for microwave monolithic integrated circuits (MMIC).

BACKGROUND OF THE INVENTION

Millimeter wave (MMW) modules are becoming more commonplace as increasing use is made of millimeter wave transceivers and similar millimeter wave devices. Often, these modules are used with various transceiver designs having different transmitter and receive circuits that make use of a number of different microwave monolithic integrated circuit (MMIC) chips or die. Many of the MMIC chips are formed from Galium Arsenide (GaAs). These chips are often attached on an alumina, i.e., aluminum oxide, or similar dielectric substrate. Because of the extreme tolerances and necessity for thermal matching, millimeter wave modules typically use an expensive coefficient of thermal expansion (CTE) matched housing material, such as copper tungsten (CuW) or aluminum: silicon carbide (AlSiC) to mount Galium Arsenide MMIC chips and the alumina or similar dielectric substrates. CTE matching is required to prevent the MMIC chips and the substrates on which they are attached from cracking as the housing material shrinks and expands during extreme temperature variations.

Most millimeter wave Galium Arsenide MMIC dies or chips and the accompanying substrates have a Coefficient of Thermal Expansion (CTE) that is between about 4 and 6 ppm/deg. Centigrade. This has required the use of similarly matched housing materials, such as the copper tungsten or aluminum silicon carbide materials. Unfortunately, the lower cost housings, such as formed from aluminum and other similar metallic or other materials, have a very high coefficient of thermal expansion, greater than about 20 ppm/deg. Centigrade. As greater uses are made for millimeter wave modules, such as millimeter wave transceivers, it would be advantageous if a unique structure and method could be found that interfaced an inexpensive aluminum or other housing and the substrate and MMIC chip material, both having different coefficients of thermal expansions, without damaging or impacting the performance of any MMIC or other material used in the module and/or transceiver.

SUMMARY OF THE INVENTION

The present invention advantageously provides a unique structure and method to interface a housing and substrate material, both having a different coefficient of thermal expansion, without damaging or impacting the performance of the MMIC chip, RF interconnects and other material components. In accordance with one aspect of the present invention, a millimeter wave (MMW) module for a microwave monolithic integrated circuit (MMIC) includes a carrier board formed of a dielectric material and having at least one MMIC die (chip) mounted thereon, and at least one interface line. A base plate is formed of a material that has a higher, unmatched coefficient thermal expansion (CTE) than the carrier board. The base plate supports the carrier board.

A housing is mounted over the carrier board and engages the base plate. This housing has at least one waveguide or subminiature coaxial connector interface, also commonly referred to as an SMA connector, mounted thereon. A flexible circuit interconnect connects the subminiature coaxial connector(s) and the MMIC die through the interface line. A thermal interface member is positioned between the carrier board and base plate to aid in heat transfer between the base plate and housing and the lower CTE carrier board.

In still another aspect of the present invention, the flexible circuit interconnect comprises one of fuzz buttons or spring loaded self-adjusting interconnects, including the use of modified forms of pogo pins and similar spring segments and resilient members. The carrier board preferably, but not necessarily, comprises a plurality of layers of low temperature transfer tape (LTTT) to form a multilayer substrate board. The base plate and housing are formed from a material such as aluminum and/or similar metallic material. The thermal interface member comprises a heat transfer gasket that is formed from one of at least a phase change material, thermally conductive elastomer, or thermally conductive paste. Fasteners can secure the base plate and housing together.

In yet another aspect of the present invention, at least one alignment member is mounted on the base plate. The carrier board has a guide receiver that receives the alignment member for aligning the carrier board relative to the base plate without damage due to CTE mismatch. At least one alignment member includes an alignment pin. The housing is preferably formed of a material having a coefficient of thermal expansion substantially matching the base plate. The interface line comprises at least one 50 Ohm microstrip interface line as is commonly used and compatible with the 50 Ohm SMA interfaces and fuzz buttons.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

The present invention is advantageous and allows a housing and substrate material with microwave monolithic integrated circuits and having different coefficient of thermal expansions to be interfaced together without damaging or impacting the performance of the substrate material and any microwave monolithic integrated circuits that are mounted thereon. This is advantageous when Galium Arsenide MMIC die and accompanying substrates (if any) are attached to a low cost carrier board, such as formed of a dielectric material, including alumina, i.e., aluminum oxide and similar materials.

An alignment mechanism is used to align the carrier board to a non-CTE matched housing and/or base plate, such as formed from aluminum or other similar low cost material. A thermal interface member, such as an interface gasket, is used to improve heat transfer between the lower CTE carrier board and the higher CTE base plate and associated housing. Signals can be transmitted from the carrier board to a connector mounted on the aluminum (or similar material) housing without damaging, or degrading, the signal path from the CTE mismatch.

Figure 1:
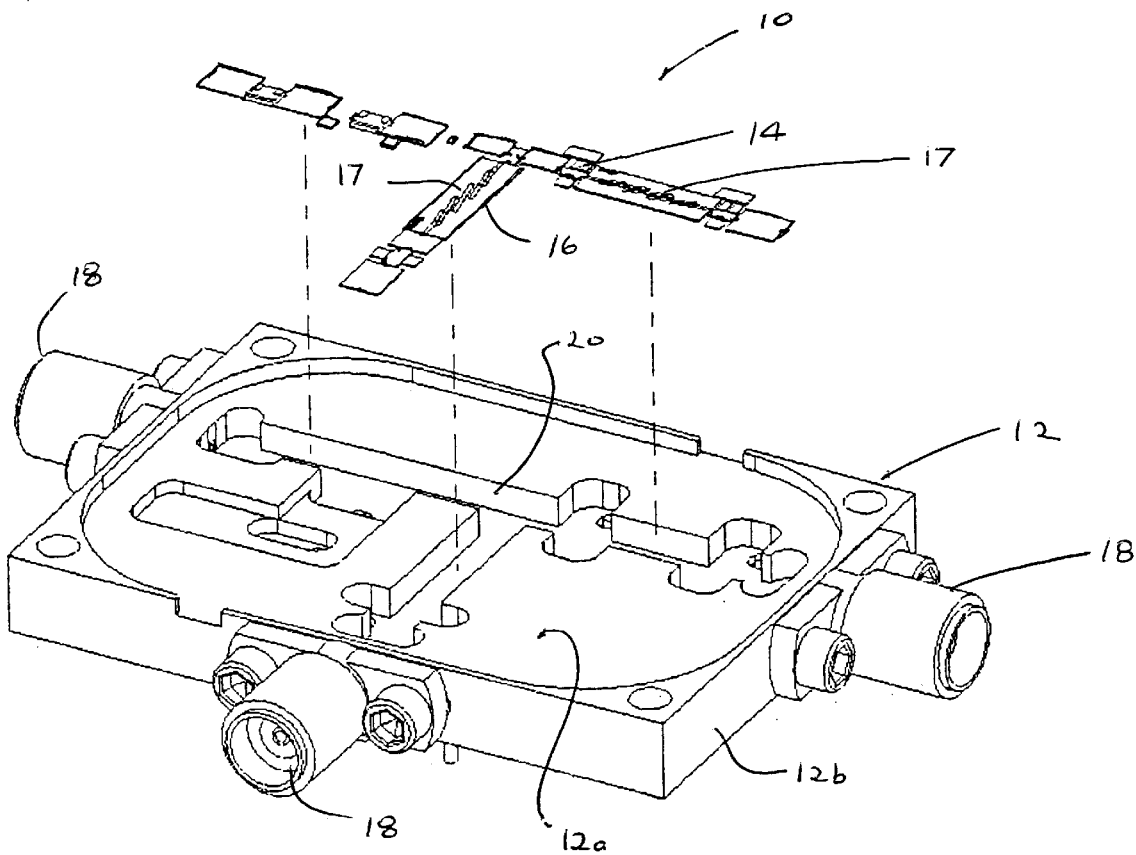
FIG. 1 is a perspective view of a prior art millimeter wave (MMW) module having a CTE matched housing.

FIG. 1 illustrates a prior art millimeter wave (MMW) module 10, such as used for a millimeter wave RF transceiver or similar device, with a housing 12 formed of a CTE matched material, including a metal carrier surface 12a and protective housing 12b. This housing is formed from a CTE matched material, such as copper tungsten (CuW) or aluminum silicon carbide (AlSiC), and used to mount Galium Arsenide microwave monolithic integrated circuit die or chips 14 with associated alumina or similar material substrates used as a carrier board 16. RF signal lines 17 connect various elements as known to those skilled in the art. The housing 12 is expensive and includes the various coaxial or other cable connectors 18 and machined chip and substrate receiving channels 20, as illustrated. The coefficient of thermal expansion for housing and substrate/MMIC chip is closely matched. In this type of design, the CTE match prevents the MMIC chips and die and associated carrier boards, including single and multilayer substrates, from cracking as the housing material shrinks and expands during temperature fluctuations. Naturally, this use of CTE matched housing material is expensive and difficult to form. The present invention overcomes these prior art drawbacks.

The present invention interfaces those materials having different coefficient of thermal expansions, such as a MMIC chip and substrate, including the carrier board, and the non-CTE matched housing without creating damage to components, while allowing the attachment of Galium Arsenide and similar MMIC die and substrates (if any) to a low cost dielectric carrier board. This could include an alumina carrier board having the MMIC die mounted thereon with various interface lines to be interfaced with a low, non-CTE matched housing. At least one alignment member is mounted on a base plate, and the carrier board has a guide receiver that receives the alignment member for aligning the carrier board relative to the base plate without damage due to CTE mismatch. Pins can be used to align the carrier to the non-CTE matched base plate and/or housing. The use of flexible circuit interconnects, such as fuzz buttons or spring-loaded self-adjusting interconnects, allows the connection of the waveguide or subminiature coaxial connectors that are positioned on the housing to the MMIC die through an interface line, such as a 50 Ohm microstrip interface line.

Figure 2:
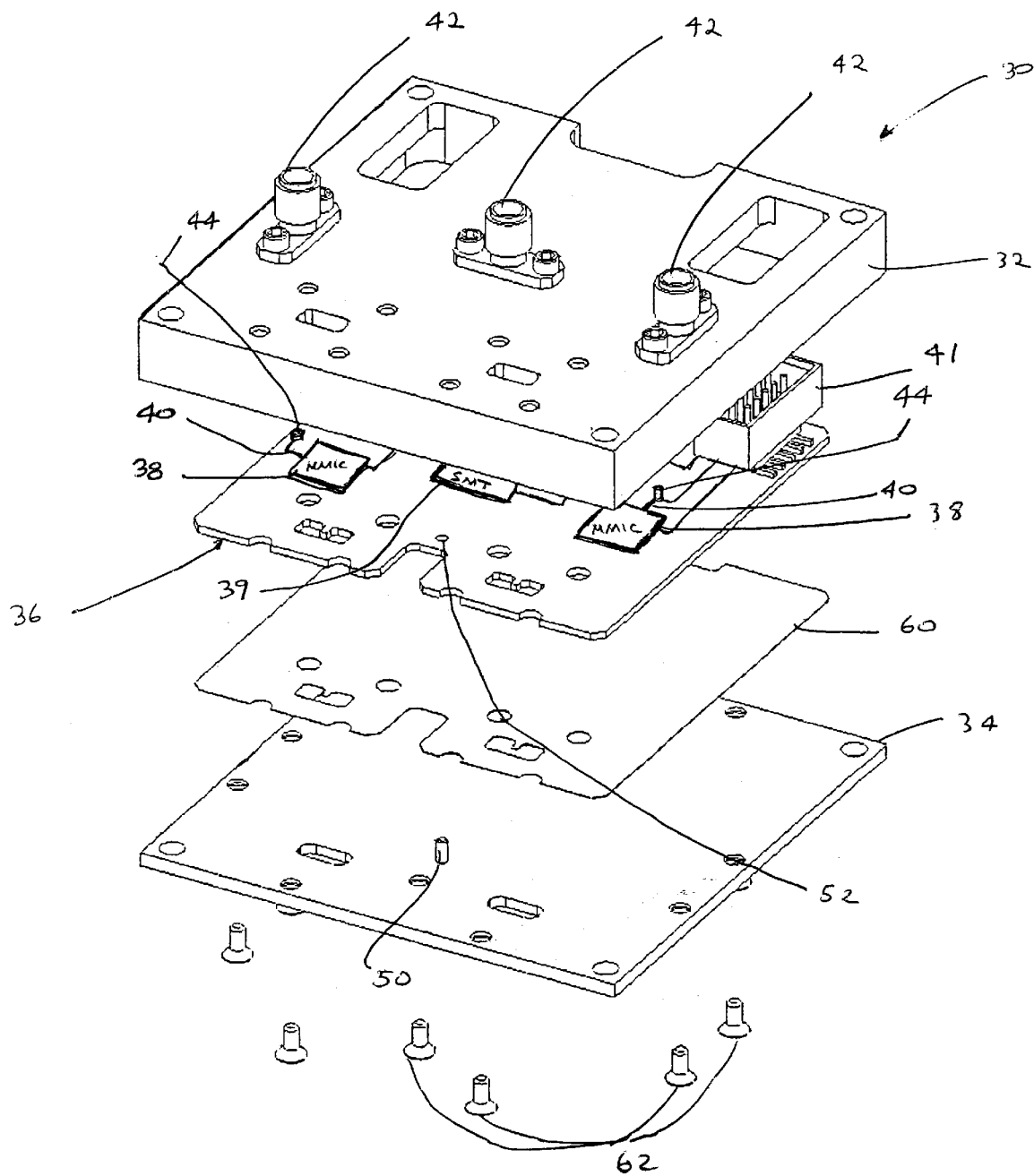
FIG. 2 is an exploded isometric view of a housing with waveguide and SMA interfaces and corresponding base plate, and a dielectric substrate material as a carrier board for MMIC chips, the housing and base plate having different coefficients of thermal expansion than substrate and MMIC chip in accordance with the present invention.

FIG. 2 is an exploded isometric view of a Millimeter Wave (MMW) module 30 of the present invention, and showing a housing 32 and base plate 34, and dielectric substrate forming a carrier board 36, the housing and base plate having different coefficient of thermal expansions than the carrier board, in accordance with the present invention. An interface can be provided between the high CTE material, such as aluminum for the housing 32 and base plate 34, and the low CTE material, such as an alumina carrier board 36, without impacting performance.

As illustrated, the carrier board 36 is formed of a dielectric material, such as alumina, and has at least one MMIC die (chip) 38 mounted thereon and other surface mount technology (SMT) components 39. At least one interface line 40 is connected to the MMIC chip and other surface mount technology components. The interface line 40 is formed typically as a 50 Ohm microstrip interface line on the carrier board by fabrication techniques known to those skilled in the art. This carrier board 36 "floats" relative to the CTE mismatched base plate 34 and housing 32, formed of a material having a higher and unmatched coefficient of thermal expansion (CTE) than the carrier board and supporting same. Other cable or interconnect components 41 can be mounted on carrier board 36 as illustrated.

In one aspect of the present invention, the base plate 34 is formed from low cost aluminum, a similar aluminum alloy, or other similar commercially available material that is low cost and desirable for these module applications. As illustrated, the MMIC die or chips 38 are preferably attached directly to the top of the carrier board 36, which is formed as an alumina carrier board or similar material and having the CTE mismatch from the aluminum base plate, but similar to the GaAs MMIC devices. The housing 32, formed from aluminum or similar material as with the base plate, is mounted over the carrier board 36 and engages the base plate 34. The housing 32 has at least one waveguide or subminiature coaxial connector interface mounted thereon, such as a waveguide and subminiature coaxial connector (SMA) 42 interface, as known to those skilled in the art.

Subminiature coaxial connectors (SMA) are commonly used by those skilled in the art and are known as semi-precision, subminiature devices that are used with coaxial cables, including flexible and semi-rigid cabling. They are used up to about 18 GHz with semi-rigid cabling, and with flexible cable, the SMA connectors are typically from DC values to about 12.4 GHz. The SMA connectors are operable at broadband frequencies and have low reflections. They can be designed to have a constant 50 Ohm impedance, as known to those skilled in the art. Many different type of SMA connectors are commercially available through many different companies, including Light House Technologies, Inc. of San Diego, Calif., and Johnson Components of Waseca, Minn. They are available in pressure crimp, clamp and solder terminal attachments and provide interconnections from various board striplines to coaxial cable, as known to those skilled in the art.

The housing 32 is typically formed of a material having a coefficient of thermal expansion (CTE) similar to the base plate 34, and as noted before, can be formed of the lower cost aluminum. A flexible circuit interconnect 44 (or interface) connects the waveguide or subminiature coaxial connector 42 and the MMIC die 38 through the microstrip (preferably 50 Ohm) interface line 40 and allows the carrier board 36 to shift relative to the housing 32 without signal degradation. Thus, a flexible interface is provided between the RF signal on the carrier board and any coaxial connectors, such as the SMA connectors, positioned on the housing.

Although fuzz buttons 44 are used in one aspect of the present invention for the flexible circuit interconnects, other spring-loaded self-adjusting interconnects can be used. Many different types of fuzz buttons are commercially available and can be modified for use with the present invention. One type of fuzz button is a gold plated molybdenum wool that fills passages through a material to provide conductive pathways. One size example is about 0.010 inch diameter by 0.060 inch in length. Examples of fuzz buttons are disclosed in U.S. Pat. Nos. 5,552,752; 5,631,446; 5,146,453; 5,619,399; 5,834,335; 5,886,590; 6,192,576; and 5,982,186. These and any other fuzz buttons can be modified to be operable with the present invention. Other types of spring-loaded self-adjusting interconnects can also be used, including modified pogo pin connectors, which can include wires, pins or cables formed as spring segments or other resilient members. Examples of various types of pogo pins are disclosed in U.S. Pat. Nos. 6,252,415; 6,242,933; 6,137,296; 6,114,869; 6,079,999; 5,451,883; and 5,948,960.

At least one alignment member 50 is mounted on the base plate 34. The carrier board 36 has a guide receiver 52 that receives the alignment member 50 for aligning the carrier board relative to the base plate without damage due to CTE mismatch. In one aspect of the present invention, the alignment member comprises an alignment pin that aligns with a guide hole or notch.

As illustrated, a thermal interface member 60 is positioned between the carrier board 36 and base plate 34 to aid in heat transfer between the base plate and housing and the lower CTE carrier board. This thermal interface member can be formed as a heat transfer gasket and can be formed from one of at least a phase change material, thermally conductive elastomer, or thermally conductive paste. This aids in supporting the heat transfer and the "floating" of the carrier board.

Fasteners 62 are used to hold the base plate 34 and housing 32 mounted over the carrier board together as a unit. The fasteners 62 can be any type of fastener suggested by those skilled in the art, but in the illustrated embodiment, are shown as screws. This particular structure is well designed for a millimeter wave transceiver design, such as disclosed in commonly assigned U.S. patent application Ser. No. 09/862,982, filed May 22, 2001. This type of transceiver design can include a number of different MMIC chips and a carrier board that is formed as a plurality of layers of low temperature transfer tape (LTTT) that form a multilayer substrate board using low temperature co-fired ceramic material, modified and formed as low temperature transfer tape using fabrication, printing and manufacturing techniques known to those skilled in the art.

Figure 3:
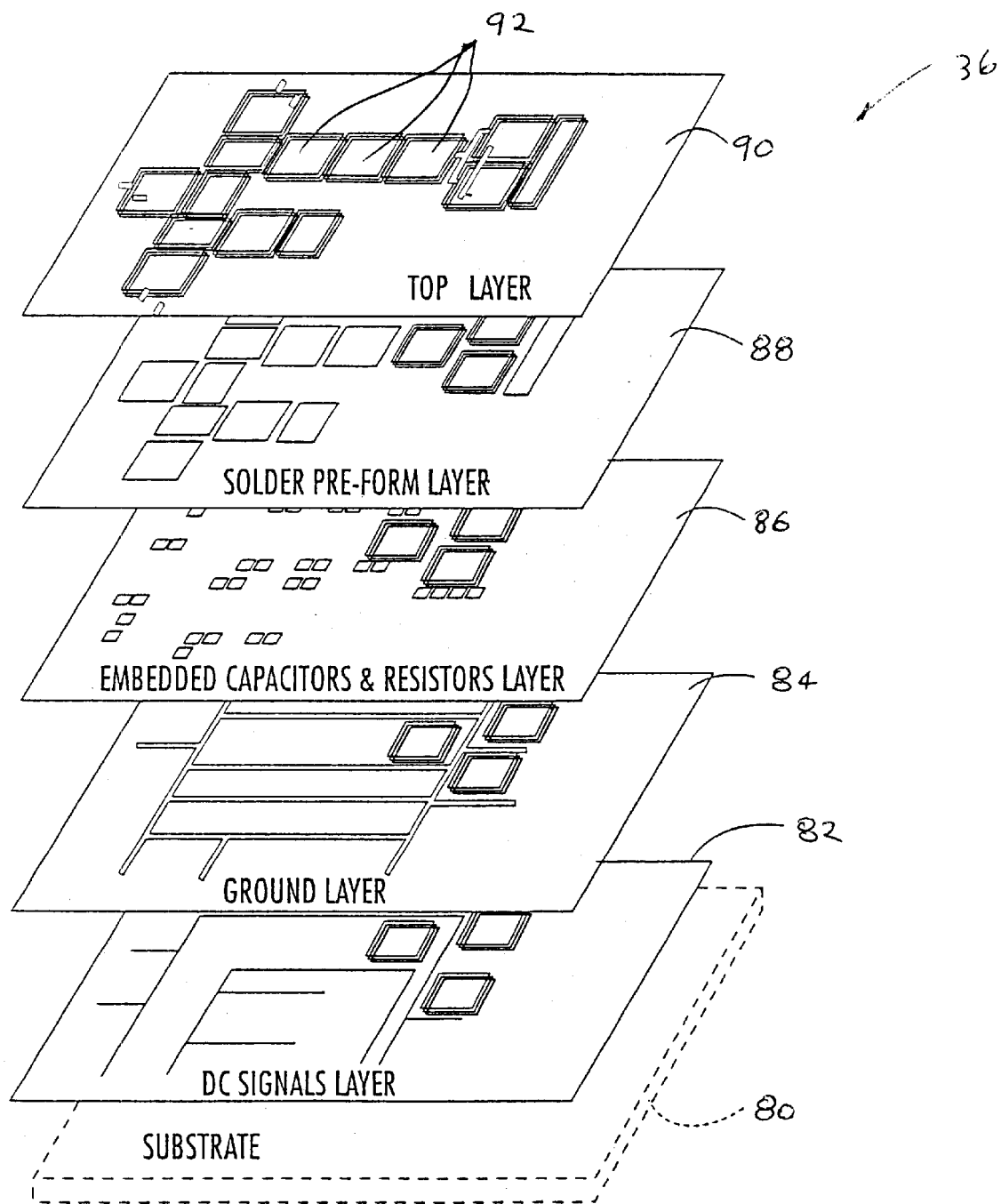
FIG. 3 is an enlarged isometric view of a carrier board formed of a dielectric material that could be used with the present invention.

FIG. 3 illustrates one type of carrier board that can be used with the present invention. As illustrated, a substrate board 80 supports different layers of low temperature transfer tape technology sheets, including a DC signal layer 82, a ground layer 84, embedded capacitors and resistors layer 86, solder preform layer 88, and top layer 90. The substrate board 80 provides support for the various layers. Cut-outs 92 can be formed with appropriate interconnects and conductive vias, signal lines and other components included within the overall board 80 structure.

It is evident that the present invention advantageously provides for an interface between a high CTE material, such as an aluminum housing, and a low CTE material, such as a carrier board that supports MMIC chips without impacting performance of the radio frequency interconnects and the MMIC chips, and various RF signal pathways and coaxial connectors.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

That which is claimed is:

1. A millimeter wave (MMW) module for microwave monolithic integrated circuit (MMIC) comprising:
   a carrier board formed of a dielectric material and having at least one MMIC mounted thereon and at least one interface line;
   a base plate formed of a material that has a higher, unmatched coefficient of thermal expansion (CTE) than the carrier board and supporting same;
   a housing mounted over said carrier board and engaging said base plate, said housing having at least one subminiature coaxial connector interface mounted thereon;
   a flexible circuit interconnect connecting said subminiature coaxial connector and MMIC die through said interface line; and
   a thermal interface member positioned between said carrier board and base plate to aid in heat transfer between said base plate and housing and said lower CTE carrier board and being formed of a material that establishes a floating non-mechanically attaching interface between the carrier board and base plate, allowing relative movement and greater compensation for CTE mismatch.

2. A millimeter wave module according to claim 1, wherein said flexible circuit interconnect comprises one of fuzz buttons or spring loaded self-adjusting interconnects.

3. A millimeter wave module according to claim 1, wherein said carrier board comprises a plurality of layers of low temperature transfer tape (LTTT), or a single-layer and multilayer combination.

4. A millimeter wave module according to claim 1, wherein said carrier board comprises a multi-layer substrate board.

5. A millimeter wave module according to claim 1, wherein said base plate and housing are formed from aluminum and/or metallic similar low cost commercially available material.

6. A millimeter wave module according to claim 1, wherein said thermal interface member comprises a heat transfer gasket.

7. A millimeter wave module according to claim 6, wherein said heat transfer gasket is formed from one of at least a phase change material, thermally conductive elastomer, or thermally conductive paste.

8. A millimeter wave module according to claim 1, and further comprising fasteners securing said base plate and housing together.

9. A millimeter wave module according to claim 1, and further comprising at least one alignment member mounted on said base plate, said carrier board having a guide receiver that receives said alignment member for aligning said carrier board relative to said base plate without damage due to CTE mismatch.

10. A millimeter wave module according to claim 9, wherein said at least one alignment member comprises an alignment pin.

11. A millimeter wave module according to claim 1, wherein said housing is formed of a material having a coefficient of thermal expansion substantially matching said base plate.

12. A millimeter wave module according to claim 1, wherein said at least one interface lines comprises at least one 50 Ohm microstrip interface line.

13. A millimeter wave (MMW) module for microwave monolithic intergrated circuit (MMIC) comprising:
   a carrier board formed of a plurality of layers of low temperature transfer tape (LTTT) to form a multilayer substrate board, said board having at least one MMIC die mounted thereon and at least one interface line;
   a base plate formed of a material that has a higher, unmatched coefficient of thermal expansion (CTE) than the carrier board and supporting same;
   a housing mounted over said carrier board and engaging said base plate, said housing having at least one subminiature coaxial connector interface mounted thereon;
   a flexible circuit interconnects comprising one of fuzz buttons and/or spring loaded self-adjusting interconnects that connect said subminiature coaxial connector and MMIC die through said interface line; and
   a thermal interface member positioned between said carrier board and base plate to aid in heat transfer between said base plate and housing and said lower CTE carrier board and being formed of a material that establishes a floating non-mechanically attaching interface between the carrier board and base plate, allowing relative movement and greater compensation for CTE mismatch.

14. A millimeter wave module according to claim 13, wherein said base plate and housing are formed from aluminum and/or similar low cost commercially available metallic material.

15. A millimeter wave module according to claim 13, wherein said thermal interface member comprises a heat transfer gasket.

16. A millimeter wave module according to claim 15, wherein said heat transfer gasket is formed from one of at least a phase change material, thermally conductive elastomer, or thermally conductive paste.

17. A millimeter wave module according to claim 13, and further comprising fasteners securing said base plate and housing together.

18. A millimeter wave module according to claim 13, and further comprising at least one alignment member mounted on said base plate, said carrier board having a guide receiver that receives said alignment member for aligning said carrier board relative to said base plate without damage due to CTE mismatch.

19. A millimeter wave module according to claim 18, wherein said at least one alignment member comprises an alignment pin.

20. A millimeter wave module according to claim 13, wherein said housing is formed of a material having a coefficient of thermal expansion substantially matching said base plate.

21. A millimeter wave module according to claim 13, wherein said at least one interface lines comprises at least one 50 Ohm microstrip interface line.

22. A millimeter wave (MMW) module for microwave monolithic integrated circuit (MMIC) die comprising:
   a carrier board formed of a plurality of layers of low temperature transfer tape (LTTT) to form a multi-layer substrate board, said board having at least one MMIC die mounted thereon and at least one 50 Ohm microstrip interface line;
   a base plate formed of a material that has a higher, unmatched coefficient of thermal expansion (CTE) than the carrier board and supporting same;
   a housing mounted over said carrier board and engaging said base plate, said housing having at least one subminiature coaxial connector interface mounted thereon;
   flexible circuit interconnects comprising one of fuzz buttons and/or spring loaded self-adjusting interconnects that connect said subminiature coaxial connector and MMIC die through said at least one 50 Ohm microstrip interface line;
   a thermal interface member positioned between said carrier board and base plate to aid in heat transfer between said base plate and housing and said lower CTE carrier board and being formed of a material that establishes a floating non-mechanically attaching interface between the carrier board and base plate, allowing relative movement and greater compensation for CTE mismatch; and
   at least one alignment member mounted on said base plate, said carrier board having a guide receiver that receives said alignment member for aligning said carrier board relative to said base plate without damage due to CTE mismatch.

23. A millimeter wave module according to claim 22, wherein said base plate and housing are formed from aluminum and/or similar low cost commercially available metallic material.

24. A millimeter wave module according to claim 22, wherein said thermal interface member comprises a heat transfer gasket.

25. A millimeter wave module according to claim 24, wherein said heat transfer gasket is formed from one of at least a phase change material, thermally conductive elastomer, or thermally conductive paste.

26. A millimeter wave module according to claim 22, and further comprising fasteners securing said base plate and housing together.

27. A millimeter wave module according to claim 22, wherein said at least one alignment member comprises an alignment pin.

28. A millimeter wave module according to claim 22, wherein said housing is formed of a material having a coefficient of thermal expansion substantially matching said base plate.

* * * * *